United States Patent

[11] 3,634,739

[72] Inventors Edgar Borchert
Belecke;
Werner Frese, Sichtigvor; Wolfgang Pikorz, Belecke; Alois Sonntag, Mulheim, all of Germany

[21] Appl. No. 94,429
[22] Filed Dec. 2, 1970
[45] Patented Jan. 11, 1972
[73] Assignee Licentia Patent-Verwaltungs-GmbH Frankfurt am Main, Germany
[32] Priority Dec. 2, 1969
[33] Germany
[31] P 19 60 424.1

[54] THYRISTOR HAVING AT LEAST FOUR SEMICONDUCTIVE REGIONS AND METHOD OF MAKING THE SAME
8 Claims, 4 Drawing Figs.

[52] U.S. Cl. 317/235, 317/234
[51] Int. Cl. H01l 11/10
[50] Field of Search 317/235, 237, 238–241

[56] References Cited

UNITED STATES PATENTS

| | | | |
|---|---|---|---|
| 3,274,460 | 9/1966 | Pessok | 317/235 |
| 3,277,352 | 10/1966 | Hubner | 317/234 |
| 3,476,992 | 11/1969 | Chu | 317/235 |
| 3,486,088 | 12/1969 | Gray et al. | 317/235 |
| 3,556,878 | 1/1971 | Ginsback et al. | 148/175 |
| 3,566,210 | 2/1971 | DeCecco | 317/235 |

*Primary Examiner*—James D. Kallam
*Attorney*—Spencer & Kaye

ABSTRACT: A thyristor having a base region shorted to an associated emitter region on one of the principal faces of the thyristor wafer, wherein there is a net impurity center concentration equal to at least $10^{18}$ impurity centers per cubic centimeter at the surface of the base region in contact with the shorting electrode, wherein there is a continual decrease of the net impurity center concentration in the base region from its value at the shorting electrode at least over the distance from the shorting electrode to the side of the emitter region farthest from the shorting electrode, and wherein there is an ohmic contact of very small contact resistance between the shorting electrode and the base region.

INVENTORS.
Edgar Borchert
Werner Frese
Wolfgang Pikorz
Alois Sonntag
BY Spencer & Kaye
ATTORNEYS.

INVENTORS.
Edgar Borchert
Werner Frese
Wolfgang Pikorz
Alois Sonntag
BY Spencer & Kaye ATTORNEYS.

THYRISTOR HAVING AT LEAST FOUR SEMICONDUCTIVE REGIONS AND METHOD OF MAKING THE SAME

BACKGROUND OF THE INVENTION

The present invention relates to a thyristor, or semiconductor-controlled rectifier, having a shorted emitter on at least one of the principal faces of the thyristor wafer; and to a method for making such a thyristor.

For certain applications of thyristors, such as in pulse-type inverters, an example of which is that set forth in U.S. Pat. No. 3,325,720 issued June 13, 1967, to August Christian Stumpe, for an "Inverter," thyristors are needed which have a low turnoff time *t* and a high critical increase rate for the forward blocking voltage. This rate, $(du/dt)_{crit}$, is defined as the maximum rate of increase in the forward blocking voltage, between the anode and the cathode, which can be tolerated without experiencing undesired firing of the thyristor. See U.S. Pat. No. 3,426,277, issued Feb. 4, 1969, to Heinz Carl for a "Method of Determining the Current Handling Capacity of a Thyristor." Turnoff time *t* is defined as the time between the application of a reverse current and the regaining of forward blocking ability.

In known silicon thyristors, such parameters are obtained as follows.

To obtain a low turnoff time *t*, the charge carrier lifetime within the silicon wafer is set at a low value; this is preferably done by diffusing in gold atoms which act as recombination centers.

To obtain a high $(du/dt)_{crit}$, the so-called shorted emitter structure is used. In this structure, a principal electrode, for example the cathode, contacts on a principal face of a thyristor wafer both an emitter region and parts of a base region extending to this principal face and forming PN-junctions with the emitter region. Thus, portions of PN-junctions are bridged or short-circuited by the principal electrode contacting this principal face.

In general, it is the cathode which forms the short-circuiting electrode; an N-emitter region is the "short-circuited emitter region" and the adjoining P-base region is the "short-circuited base region." The short-circuited N-emitter region is set into the short-circuited P-base region and, in the case of wafers of large surface area, is pierced by auxiliary, P-conductive "short-circuiting channels." These channels form additional connections between the short-circuited P-base region and the short circuiting electrode. In general, the gate electrode is also on the principal face containing the short circuiting electrode, on the short-circuited P-base region. In the vicinity of the gate electrode, the P-base region and the part of the N-emitter region bordering on the P-base region are not covered by the short circuiting electrode.

An important disadvantage of the known thyristors is their high value of the characteristic ratio $t/\tau$; *t* is as above defined and $\tau$ equals the lifetime of the charge carriers within the silicon wafer. In such cases, a low turnoff time *t* requires a very low carrier lifetime $\tau$. As a result, thyristors having a small turnoff time exhibit relatively low maximum allowable forward and reverse blocking voltages. Because of the small carrier lifetime within the silicon wafer, the base region must be relatively thin, in order to obtain sufficiently good forward current flow. However, in the case of thin base regions, the maximum allowable blocking voltages are necessarily low. In the case of known thyristors having sufficiently small turnoff times for use in pulse-type inverters, the maximum allowable blocking voltages are substantially less than 1,000 volts. These low blocking voltages bar the application of the known thyristors in technically interesting inverter circuits.

SUMMARY OF THE INVENTION

An object of the present invention, therefore, is to provide a thyristor having, in comparison to known thyristors, a considerably lower, technically more favorable $t/\tau$ ratio, at relatively large carrier lifetime $\tau$ a turnoff time *t* sufficiently small for use in pulse-type inverters, and maximum-allowable blocking voltages larger than 1,000 volts, which maximum voltages are, for example, several hundred volts larger than the maximum allowable blocking voltages possessed by known thyristors having the same turnoff time.

This as well as other objects which will become apparent in the discussion that follows are achieved, according to the present invention, by a thyristor of the shorted emitter type wherein there is a net impurity center (atom) concentration equal to at least $10^{18}$ impurity centers per cubic centimeter at the surface of the shorted base region in contact with the shorting electrode, wherein there is a continual decrease of the net impurity center concentration in the shorted base region from its value at the shorting electrode at least over the distance from the shorting electrode to the side of the shorted emitter farthest from the shorting electrode, and wherein there is an ohmic contact of very small contact resistance between the shorting electrode and the shorted base region.

DESCRIPTION OF THE PREFERRED EMBODIMENTS

In a thyristor having the characteristics as set forth in the above section entitled "Summary of the Invention," the interface between the thyristor wafer and the short circuiting electrode acts as a sink for excess (injected) charge carriers, after the current flow between the anode and the cathode has changed from the forward direction to the reverse direction and the superimposed blocking current has died out. This has the effect of supplementing the effect of recombination centers within the semiconductor wafer. The high $(du/dt)_{crit}$ and the lessened temperature dependence of the breakover voltage obtained by the partial shorting of the PN-junction between the emitter and base regions are not negatively influenced by the characteristics of the present invention as set forth in the "Summary of the Invention;" quite the contrary, these properties are improved.

An advantageous embodiment of a thyristor according to the present invention is that in which the layer of the short circuiting electrode in actual contact with the base region is a layer containing gold as a substantial component. It is preferred that the gold be present in this layer in at east an amount equal to its eutectic percentage with silicon.

A preferred embodiment of the present invention is a thyristor having a NPNP-structure, in which the shorted N-emitter is pierced by a plurality of channels of the shorted P-base and both of these regions are short circuited by a cathode contact extending over and beyond the N-emitter region. In addition, the net concentration of acceptors in the short-circuited P-base region continually decreases from the interface with the short circuiting electrode down to the PN-junction formed between the two base regions of the thyristor. The interface has a high recombination rate.

Figure 1:
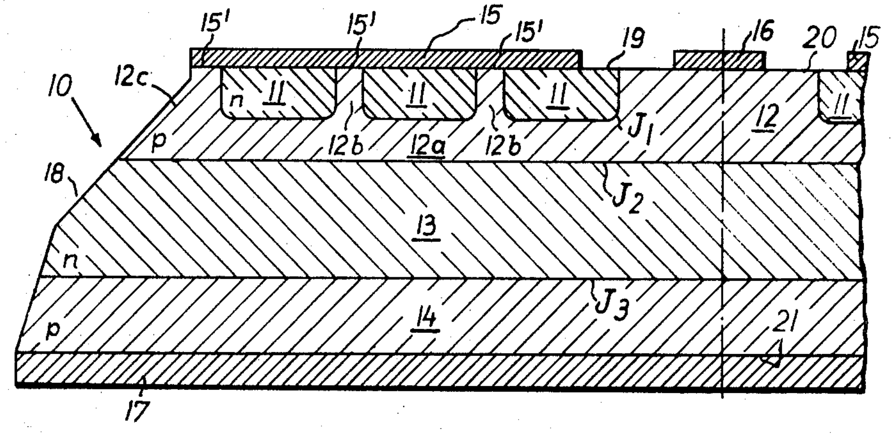
FIGS. 1, 2 and 3 are elevational cross sections through thyristors according to the invention. Crosshatching has been omitted from the semiconductor regions of FIG. 2.

Referring specifically to FIG. 1 of the drawing, there is shown a thyristor wafer 10 of silicon. Current connections and a housing have been omitted for added clarity in presenting the essentials of the invention. This thyristor has an NPNP-structure and is partially short circuited between the emitter region and the base region at principal face 20 of the wafer.

The thyristor of FIG. 1 is suited for use in pulse-type inverters. Its turnoff time is less than 30 microseconds. It causes a voltage drop during forward current flow of less than 1.8 volts at a current density of 333 amperes per square centimeter. Its maximum allowable forward and reverse blocking voltages are usually 1,200 volts. These values are for temperatures of from 25° to 125° C.

The thyristor wafer 10 of FIG. 1 contains four semiconductive regions arranged in succession between the two principal faces 20 and 21, namely N-emitter region 11, P-base region 12 having parts **12*a*, 12*b*, and 12*c*, N-base region 13, and P-emitter region 14. Neighbors of these four regions are always of opposite conductivity type. Thus, considering N-emitter region 11, its neighboring region, region 12, is of the opposite conductivity type, namely P-type The four regions form three PN-junctions $J_1$, $J_2$, and $J_3$. This NPNP-sequence is produced by diffusing gallium and phosphorus into an originally N-conducting, phosphorus-doped silicon wafer. The thyristor of FIG. 1 is further illustrated by the following exemplary values. The silicon wafer 10 is $320\times10^{-6}$ meters thick, while its largest diameter (across principal face 21) measures 27 millimeters. Cathode 15, which is a short circuiting electrode partially bridging the PN-junction $J_1$, is annular, having an inner diameter of 5 millimeters and an outer diameter of 22 millimeters. The gate electrode 16 is in the form of a circular disc, having a diameter of 2.5 millimeters. Cathode 15 and gate electrode 16 are made of a base layer of gold-silcon eutectic, about $1\times10^{-6}$ meters thick, and, on top of this base layer, a layer composite of sequence chromium-gold-chromium vapor deposited and having a total thickness of about $2\times10^{-6}$ meters. The anode 17 is a molybdenum disc having a diameter of 27 millimeters and a thickness of 1 millimeter. This molybdenum disc is bonded by an alloying process to the silicon wafer, there being interposed between the silicon wafter and the molybdenum disc a film of silumin (aluminum-silicon eutectic). The thin recrystallized likewise P-conductive region on the lower side of P-emitter region 14 resulting from the alloying process and the thin eutectic layer abutting against this recrystallized region for bonding the molybdenum disc 17 to the silicon wafer 10 are not illustrated in FIG. 1. Also not shown is a thin gold layer on the lower side of molybdenum disc 17 in FIG. 1**.

The edge 18 of the silicon wafer 10 is a conical surface. The inclination of the edge 18 and a coating of insulating and stabilizing material on the edge (not shown) together prevent surface breakdown during application of forward or reverse blocking voltages.

The N-emitter region 11 is annular. It has an inner diameter of 3.5 millimeters and an outer diameter of 21 millimeters. This region is, according to the transverse field emitter principle, covered by the cathode 15, except in an annular area 19 measuring radially 0.75 millimeters from the inner diameter of cathode 15 to the inner diameter of region 11. A plurality of P-conductive short circuiting channels in the form of spikes **12*b* pierce the annular N-emitter region 11. These spikes 12*b* connect part 12*a* of the P-conductive base region 12 with the cathode 15. As shown, P-conductive part 12*a* lies between region 11 and PN-junction $J_2$. The diameters of the spikes 12*b* amount to 0.5 millimeters. The spikes 12*b* may be arranged such that they appear as a square array of circular areas, each of a diameter equals 0.5 millimeters, in the plane of principal face 20 within the area occupied by the surface of region 11. An annular area having a radial dimension of 2 millimeters measured inwards from the inner diameter of the N-emitter region 11 contains no spikes 12*b*. In contrast, there is a relatively dense arrangement of spikes 12*b* near the outer edge of emitter region 11. Besides the spikes 12*b*, there is also an annular short circuiting P-conductive region 12*c* arranged on the outer edge of N-emitter region 11 and connecting the base part 12*a* with the cathode 15**.

Table I gives further details concerning regions 11 to 14.

TABLE I.—FURTHER EXEMPLARY DETAILS FOR FIGURE 1

| | Conductivity type | Thickness in μm | Doping data | Miscellaneous |
|---|---|---|---|---|
| 11 | n | 32 | $N_S$=about $10^{21}$ cm.$^{-3}$ | |
| 12 | p | 78 | $N_S=4\cdot10^{18}$cm.$^{-3}$ | |
| 12a | p | 46 | $\rho_S$=about 150 Ohm. | |
| 12b–12c | p | 32 | $N_S=4\cdot10^{18}$cm.$^{-3}$ | (1) |
| 13 | n | 164 | $\rho$=55 Ohm·cm. | $\tau$≡10–15 μs. |
| 14 | p | ca. 78 | $N_S$=ca. $4\cdot10^{18}$cm.$^{-3}$ | |

[1] In the short-circuiting spikes 12b and in the short-circuiting edge region 12c, as well as in the region 12a beneath these shortcircuiting regions the net concentration $|N_A-N_D|$ decreases continually from the cathode 15 to the pn-junction $J_2$.

NOTE.—$N_S$ equals the net concentration of the conductivity-type-determining impurity centers ($|N_A-N_D|$) at the surfaces between the thyristor wafer and the electrodes 15, 16, or 17. Other symbols are defined as follows:

$N_A$=the acceptor (gallium) concentration in atoms/cm.$^3$.
$N_D$=the donor (phosphorous) concentration in atoms/cm.$^3$.
$\rho_S$=the layer resistance.
$\rho$=resistivity.
$\tau$=charge carrier lifetime, determined as discussed.

It is assumed that the thyristor of the present invention gives a lower $t/\tau$ ratio due to the following mechanism. This mechanism will be explained with the use of FIG. 2. The mechanism begins, in the case of a forced extinguishing of conduction in the thyristor, at the latest when, following the reversal of current flow from the forward direction into the reverse direction, the superimposed reverse blocking current has died out. At this point in time, i.e., after the superimposed negative blocking current has died out, there are still a large number of excess holes and electrons present on both sides of the PN-junction $J_2$ in the P-base region **12*a* and in the N-base region 13. These excess holes and electrons were injected during the preceding operation of the thyristor in its high-conductivity state with current flow in the forward direction. In contrast, the short circuiting spikes 12*b* and the short circuiting edge region 12*c* near the cathode and the lower PN-junction $J_3$ (see FIG. 1**) are already free of excess charge carriers. The excess charge carriers still existing on both sides of the junction $J_2$ can disappear essentially only through recombination, since the negative blocking current has already died out. Only after the elimination of these excess charge carriers does the thyristor regain its ability to block current flow in the forward direction. This elimination process, the duration of which significantly contributes to the turnoff time *t* and which is effected in known thyristors essentially by recombination on both sides of the junction $J_2$, is significantly accelerated in thyristors according to the present invention by surface recombination in certain regions of the contact interface between the cathode 15 and the silicon wafer 10. It is believed that this additional recombination mechanism proceeds as follows.

Figure 2:
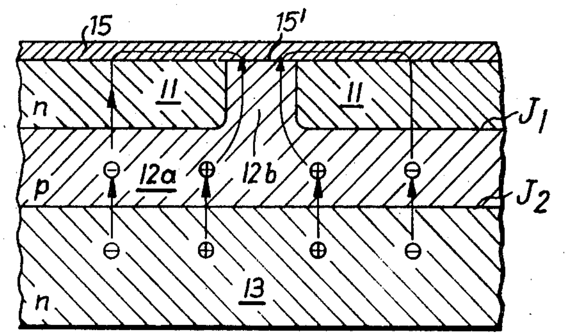

Referring to FIG. 2, holes flow toward cathode 15 in the short circuiting regions **12*b* and 12*c*, because there is an electrical drift-field present in the direction toward the cathode. This drift-field exists between the cathode 15 and the PN-junction $J_2$ in the absence of current, because the net acceptor atom concentration ($N_A-N_D$) continually decreases in passing from the cathode 15 to the PN-junction $J_2$ through short circuiting region 12*b* or 12*c* and region 12*a*. The drift-field always arises anew following current reversal from the forward direction into the reverse direction and the dying-out of the superimposed reverse blocking current. The zone in which the drift-field exists grows from the cathode 15 toward the central PN-junction $J_2$ as the excess charge carriers disappear. The holes transported by the drift field recombine at the contacts between the cathode and the short circuiting regions. The recombination partners are electrons which have flowed from the P-base region 12*a*, through the PN-junction $J_1$, through the emitter region 11, through the cathode 15, to the interfaces between the cathode and the short circuiting regions. The larger the drift field and the conductivity in the short circuiting regions, i.e., the greater the maximum and the gradient of the net acceptor concentration ($N_A-N_D$), and the greater the recombination speed at the interfaces between the cathode and the short circuiting regions, the faster excess charge carriers are removed from the P-base region 12*a*. As the region 12*a* becomes depleted in excess charge carriers, holes and electrons flow out of the N-base region 13, through the central PN-junction $J_2$, and into region 12*a***. Consequently, the mechanism as described accelerates the elimination of excess charge carriers on both sides of the junction $J_2$ and, in doing so, supplements the effect of the recombination centers present within the silicon wafer.

The end effect of the particular form of the shorted emitter principle according to the present invention on the ratio $t/\tau$, besides depending on the particular characteristic features as set forth above in the section "Summary of the Invention," also depends on other geometrical and physical parameters. Examples of such parameters are the cross-sectional area of the spikes 12b, the distances between adjoining spikes 12b, and the layer resistance and thickness of the P-base region 12a. These parameters influence, apart from the ratio $t/\tau$, still other important properties of a thyristor. Consequently, they can only be varied within certain limits.

The particular parameter values given above for the thyristor of FIG. 1 represent a favored compromise and satisfy a series of requirements. On the other hand, the number, and thus the total cross-sectional area, of the short circuiting spikes 12a is chosen so large, that both a substantial lowering of the $t/\tau$ ratio and a high $(du/dt)_{crit}$ are obtained; at the same time, the reduction of the active cathode surface area, i.e., that part of the cathode which is in contact with the N-emitter region 11, resulting from the existence of the short circuiting spikes 12b, is so small, that the forward current flow properties are only minimally affected.

In the following, the essentials of the manufacture of a thyristor according to the present invention are described.

The starting semiconductor material is in the form of a circular disc of N-conductive silicon, having a resistivity of about 55 ohm-cm., a diameter of 29 millimeters and a thickness of $320\times10^{-6}$ meters. This wafter is lapped on both sides. An etched wafer can also be used.

After cleaning the wafter with trichloroethylene, acetone, and aqua regia, a gallium diffusion is carried out at about 1,260° C. over a period of 40 hours. The wafer is situated together with the gallium source in a closed quartz ampul of the same temperature during the diffusion process. The gallium source is a piece of silicon held in a quartz boat. About 20 milligrams of gallium are dissolved in the piece of silicon. A distance piece made of quartz spaces the silicon wafer about 30 centimeters from the gallium source. The gallium diffusion gives to the silicon wafer a PNP-structure. The P-conductive regions are about $70\times10^{-6}$ meters thick, and the gallium concentration at the surface of the wafer (net acceptor concentration after substracting the original donor concentration) equals between about $1\times10^{18}$ and $3\times10^{18}$ atoms per cubic centimeter.

Then, the wafer is cleaned in aqua regia and subsequently oxidized. The oxidation proceeds at 1,220° C. for a period of 2 hours in a flow of oxygen containing water vapor. The resulting silicon dioxide layer is then removed from those surface areas on principal face 20 through which phosphorus is to be diffused to produce the N-emitter region 11. This partial removal of the silicon dioxide layer is accomplished by etching in dilute hydrofluoric acid. Areas of the silicon dioxide layer which are not to be etched are protected by a coating resistant to hydrofluoric acid. This coating is applied by a silk screen process.

Following repeated cleaning in trichloroethylene, acetone, and aqua regia, the wafer is then subjected to a diffusion process in which gallium phosphide serves as the source. The diffusion temperature amounts to about 1,260° C., and the diffusion is carried out over a period of about 9 hours. The diffusion process takes place in a closed quartz ampul held at 1,260° C. and containing the gallium phosphide source. The source comprises about 20 milligrams of gallium phosphide held in a quartz boat. This gallium phosphide diffusion transforms the PNP-structure into the final NPNP-structure as illustrated in FIG. 1. While phosphorus atoms only diffuse into the wafer through the areas free of oxide to form the N-emitter region 11, the gallium atoms of the gallium phosphide source diffuse into the wafer through all of the surface area of principal face 20 and all remaining surface of the water irrespective of whether or not oxide is present. The gallium vapor pressure in the quartz ampul is higher during the second diffusion than it was during the first gallium diffusion. Following the gallium phosphide diffusion, the gallium atom concentration on the principal face 20 of the wafer, at least in the oxide-covered areas and especially at the surface areas for abutment with the cathode 15, is higher than it was after the first gallium diffusion and net concentration after substracting the original donor concentration equals, for example, $4\times10^{18}$ atoms per cubic centimeter. In the oxide-free surface areas, through which the phosphorus diffused, the phosphorus surface concentration is substantially greater than the gallium surface concentration.

After the gallium phosphide diffusion, the silicon wafer exhibits a high net acceptor surface concentration ($N_A-N_D$) in the surface areas of the regions 12b and 12c. Additionally, the value of ($N_A-N_D$) continually decreases in going from the surface areas of the regions 12b and 12c toward the central PN-junction $J_2$; there is never an incremental distance into the wafer toward junction $J_2$ over which there is an increase of the value ($N_A-N_D$). Without simultaneous gallium diffusion during the phosphorus diffusion at a gallium vapor pressure at least as high as it was during the first gallium diffusion, the gallium concentration in the surface and adjoining parts of the silicon wafer would sink below the concentration achieved during the first gallium diffusion. The result would be that the net acceptor concentration in the surfaces of the regions 12b and 12c would be too low. Furthermore, the continually decreasing behavior of the net acceptor concentration as one goes from the surface toward the junction $J_2$ would be lost.

An The carrying out of two diffusion steps—a first gallium diffusion and a subsequent simultaneous phosphorus—gallium diffusion—makes possible in advantageous manner both the selection of substantially mutually independent thicknesses of the two regions 11 and 12a and the selection of the above-mentioned characteristics of the net acceptor concentration.

It is usual practice to simultaneously process a number of the silicon wafers. In order to determine the most important of the parameters, namely the geometrical dimensions and doping concentrations of the separate conductivity regions and the charge carrier lifetime within the wafer interior, some wafers are removed from the gallium phosphide diffusion charge. The carrier lifetime is determined as follows.

A number of the removed wafers are cleaned with hydrofluoric acid and then small test discs having 7 millimeter diameters are cut out of the wafers using ultrasonic boring techniques. These test discs are lapped on one side until the P-base region (including the sections 12a, 12b, and 12c) and the N-emitter region are removed. Then the test discs are etched for a short time in a mixture composed of 2 parts fuming nitric acid, 1 part of 40 percent hydrofluoric acid, and 1 part glacial acetic acid, where their thickness is reduced by several $10^{-6}$ meters. Following this etching, the test discs are alloyed to form $PNN^+$-structured test diodes with metallic electrodes. The anode is a molybdenum disc having a diameter of 7 millimeters. The anode is bonded to the P-emitter region 14 by way of a silumin (aluminum-silicon eutectic) film which undergoes melting during the alloying process. The cathode is essentially gold-silicon eutectic obtained by alloying onto the bared N-base regions 13 of the test discs a $50\times10^{-6}$ meter thick antimony-containing gold film of 5 mm. diameter. During the execution of this alloying of the antimony-containing gold film, there arises beneath the resulting cathode a strongly N-conductive recrystallized silicon region ($N^+$-region) having a thickness of about $15\times10^{-6}$ meters and being doped with antimony. The thus-produced test diodes with $PNN^+$-structure and containing the PN-junction $J_3$ are then etched for a short time in a mixture composed of 1 part fuming nitric acid, 1 part hydrofluoric acid (40 percent solution), and 1 part glacial acetic acid, in order to remove any remaining edge material which has was crystallographically disturbed by the ultrasonic boring. These test diodes are then used for measuring the carrier lifetime according to the injection-extraction method of R. H. Kingston. A 5-milliampere forward current and a 1-milliampere reverse current are used. The carrier lifetime is determined from the following equation:

$$erf\sqrt{\frac{t_I}{\tau}}=\frac{1}{1+i_R/i_F}$$

where erf indicates the gauss error function, $t_I$ = the time interval between the switching of the current from the forward direction into the reverse direction and the zeroing of the voltage in passing from the forward direction into the reverse direction, $i_F$ = the forward current, and $i_R$ = the reverse current.

If the $\tau$-values lie between 10 and 20 microseconds, which is usually the case, then the remaining NPNP-wafers of the gallium phosphide diffusion charge are provided with electrodes 15, 16 and 17. In the exceptional case, when the $\tau$-values lie outside of the named range, the carrier lifetime is lowered or raised by process steps which are known in principal. In such cases, the geometrical dimensions and the doping concentrations of the individual regions are, apart from regions of very small thickness immediately adjacent the wafer surfaces, only insignificantly changed. The carrier lifetime is then again determined by the above-described method. In the process steps for placement of the electrodes 15, 16, and 17, the temperature of the silicon wafers rises at most for 15 minutes to a maximum of 730° C. These process steps are consequently practically without influence on the parameters of the silicon wafers, apart from thin regions bordering on the wafer surfaces, where the doping concentration and the carrier lifetime are changed. Also, the carrier lifetime within the interior of the wafers remains almost the same as before the application of the electrodes.

The NPNP-wafers are provided with electrodes 15, 16, and 17 by several vapor deposition processes and by one alloying process. Following the phosphorus—gallium diffusion, the oxide still remaining on the NPNP-wafers is removed with hydrofluoric acid. Then, to form the base layers of cathode 15 and gate contact 16, there is vapor deposited a gold film having a thickness of about $1\times10^{-6}$ meters. During this vapor deposition process, the wafer temperature lies below 200° C. There follows an alloying process wherein the wafer temperature rises to 720° C. This temperature is maintained for about 10 minutes. As a result of this alloying process, the gold base layers of the cathode 15 and gate 16 alloy into the silicon. Simultaneously, the P-emitter region 14 is bonded to the molybdenum disc 17, the anode, using a silumin (aluminum-silicon eutectic) film, having a thickness of about $30\times10^{-6}$ meters.

The alloying of the thin gold base layer into the silicon wafer provides in a simple and advantageous manner an ohmic contact of very small contact resistance and high recombination speed between the contact 15 and the short circuiting regions 12*b* and 12*c*. A contact of the same properties is formed between the gate electrode 16 and the centrally situated part of the P-base region 12. The simultaneously formed contact between cathode 15 and the N-emitter region 11 has also a very small contact resistance. As a result of the alloying process, there is obtained a very thin (on the average less than $1\times10^{-}$meters thick) region of recrystallized silicon lying beneath a eutectic layer containing essentially gold and silicon. Gold is present in high concentration in this recrystallized region. At least in those parts of the recrystallized region which border on the gallium-doped P-base regions 12*b* and 12*c*, the incorporated gold atoms act as recombination centers. These parts of the recrystallized, very thin region are interfaces of very high recombination speed between the P-base regions 12*b* and 12*c* and the metallic electrode layers.

Through a series of further vapor deposition processes, in which the temperature of the silicon wafter lies below 200° C., the alloyed base layers of the cathode 15 and gate 16 are provided with, in the order stated, a chromium layer of about $0.2\times10^{-6}$ meters thickness, a second gold layer of about $1\times10^{-6}$ meters thickness, and finally a second chromium layer of about $0.5\times10^{-6}$ meter thickness. After this, the edge 18 is formed by grinding and etching in a mixture composing of nitric acid, hydrofluoric acid, acetic acid to yield the final form illustrated in FIG. 1. During the etching of edge 18, the exposed portions of the N-emitter region 11 and the P-base region 12 lying between the cathode 15 and the gate 16 are covered to protect them from the etchant.

Following the stage reached as illustrated in FIG. 1, the exposed surfaces of the silicon wafer, especially edge 18, are coated with silicone rubber, the coated surfaces and the silicone rubber are heated to a 200° C. maximum temperature to stabilize the voltage current characteristics, pressure-contacting current supply lines are mounted to the wafer, and the wafer is housed.

Figure 3:
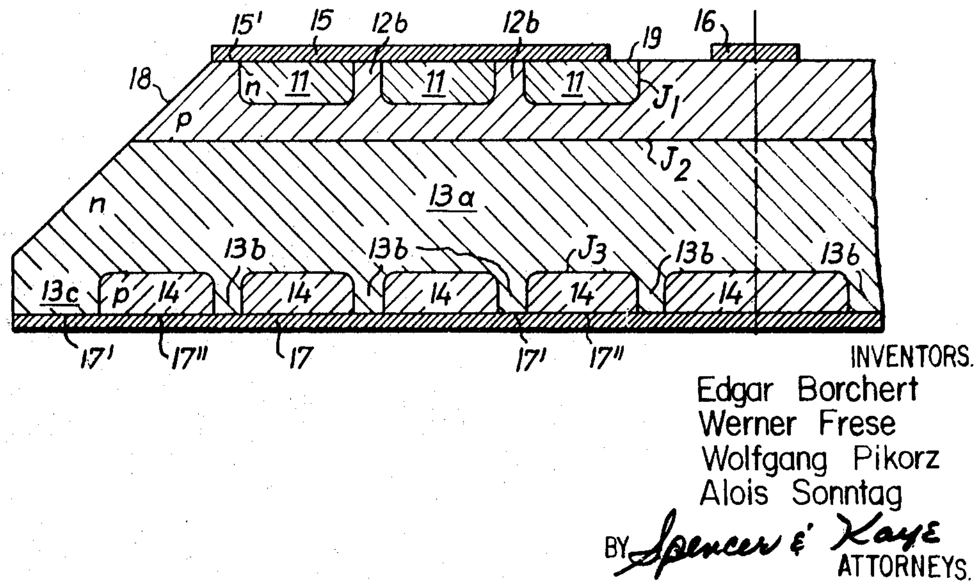

The above-described example of the present invention concerns silicon thyristors, whose cathode is in the form of a short circuiting electrode. However, the present invention is not limited to such thyristors. It encompasses other thyristors, in which at least the PN-junction between emitter and base regions on one side of the thyristor wafer is partially short circuited by an electrode. FIG. 3 illustrates an example of other possibilities of embodying the present invention. There, the cathode and the anode are formed as short circuiting electrodes. Insofar as the electrodes, regions, and PN-junctions of FIG. 3 are arranged and formed as in FIG. 1, they are provided with the same reference numerals as were used in FIG. 1. In the thyristor of FIG. 3, the N-base region 13 is formed of the section 13*a* lying between the PN-junction $J_2$ and those portions of the PN-junction $J_3$ running parallel to junction $J_2$, of the short circuiting spikes 13*b*, and of the edge short circuiting region 13*c*. The short circuiting regions 13*b* and 13*c* connect the N-base region 13*a* with the anode 17. Such thyristors block only in the forward direction, that is when the cathode 15 is negative in relation to the anode 17. The disadvantage of an absent blocking ability in the reverse direction is accepted in some applications in return for a very high $(du/dt)_{crit}$ for the forward blocking voltage and a very small turnoff time. The blocking voltage in such applications in the reverse direction is borne by a diode connected in series with the thyristor. A very high $(du/dt)_{crit}$ is achieved when the shorted emitter principle is used on both sides of the thyristor wafer. If the shorting is furthermore carried out according to the principles of the present invention, there is additionally obtained an especially advantageous, very low $t/\tau$ ration, because then both principal faces of the thyristor wafer act as sinks for excess charge carriers after the end of forward current flow. Both principal faces supplement the action of the recombination centers within the interior of the semiconductor wafer. The previously described, assumed conduction mechanism leading to recombination of the charge carriers at the interfaces 15' on the cathode side is similar on the anode side in the case of FIG. 3. In the short circuiting spikes 13*b* and in the edge sort circuiting region 13*c*, there arises an electrical drift field directed from the interfaces 17' toward the N-base region 13*a*. The field in this case is caused by a continually decreasing behavior of the net donor concentration ($N_D$—$N_A$). As a result of the drift field, electrons flow out of the N-base region 13*a*, through the shortcircuiting regions 13*b* and 13*c*, to the interfaces 17'. At the same time, holes flow out of the N-base region 13*a*, across the PN-junction $J_3$, to the interfaces 17''. The recombination occurs at the interfaces 17'', because holes do not pass through the interface 17'', while the electrons can move through the interfaces 17' into the anode 17 and thence to the interfaces 17''. In order that as many charge carriers as possible per unit time can be removed by this process from the N-base region 13*a*, the recombination speed in the interfaces 17'' must be high. This condition is, in general, met, because it follows from a small contact resistance between the anode 17 and the P-emitter region 14, a condition which is indispensable for adequately good forward current conduction properties. Additionally, according to the present invention, the contacts between the anode 17 and the short circuiting regions 13*b* and 13*c* must be ohmic contacts of very small contact resistance. Then the interfaces 17' have no influence on the electron concentration in the N-conductive short circuiting regions 13*b* and 13*c*—i.e., the drift field is not disturbed—and the electrons can pass unhindered into the anode 17. Concerning the contact between a metallic electrode and a P-conductive region, thus the contact between anode 15 and the P-conductive short circuiting regions 12*b* and 12*c*, the expression "ohmic contact" is to indicate that the recombination speed at the interfaces between metal and semiconductor, for example at the interfaces 15', is high. It is not not necessary that the net donor concentration ($N_D$—$N_A$) continually decrease in going from the interfaces 17' all the way to the PN-junction $J_2$. The flowing of the electrons out of the N-base region 13*a* to the interfaces 17' proceeds with sufficient speed if the net donor concentration ($N_D$—$N_A$) decreases continually from the interfaces 17' only at least to a depth equaling the thickness of the P-emitter region 14 and then is constant through the N-base region 13*a* to the PN-junction $J_2$.

It will be evident to those skilled in the art that, where a continually decreasing behavior in net dopant concentration is called for herein, it is needed in order to make the drift field effective in transporting charge carriers. If there would be an incremental distance over which an increase in net dopant concentration would occur, then a barrier to charge carrier transport would be set up at the location of this incremental distance.

As used in the following claims, the term "very small contact resistance" refers to a resistance about equal to the resistance achieved with the gold-silicon eutectic base layer as above described, and to all resistances lower than that achieved with the gold-silicon eutectic base layer. In a typical embodiment, in a thyristor, the aforesaid contact resistance is between $1\times10^{-6}$ and $5\times10^{-6}$ ohms.

In a preferred embodiment of the present invention the ratio of the total area of spikes 12*b* to emitter area 11 in principal face 20 amounts to 1/28, the spikes being equally spread over the face leaving out a small edge region of the face as well as a region around the contact area of the base contact 16. The value of the ratio may vary, depending on the size of the wafer, between about 1/20 and 1/40.

Figure 4:
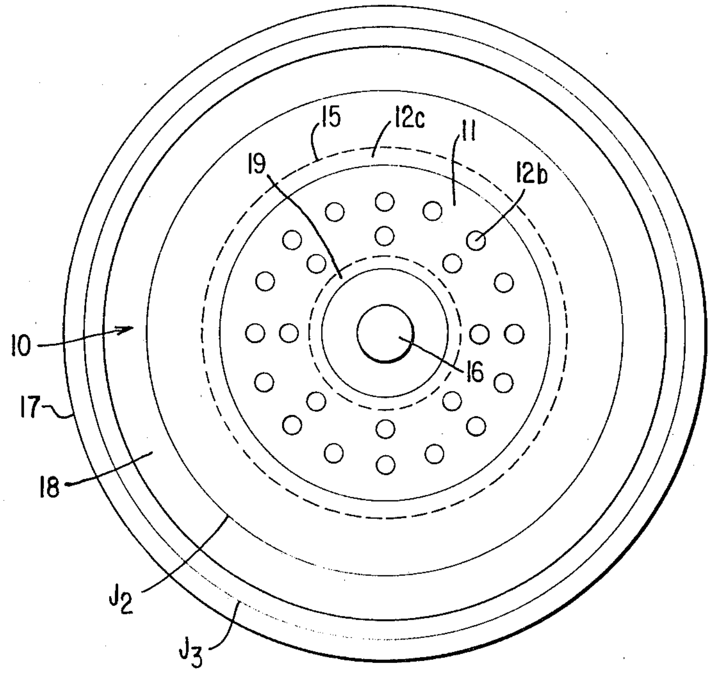
FIG. 4 is a plan view of principal face 20 of FIG. 1.

FIG. 4 shows the distribution of the spikes 12*b* in the plane of face 20. Conformably to FIG. 1, four spikes are aligned on each of four diameters the face 20, the total number of spikes being 24. Bearing in mind that FIGS. 1 and 4 are simplified representations, it is obvious that the number of spikes would be indeed much greater, for example 100, in an actual embodiment of the invention. In FIG. 4 the ring-shaped emitter contact 15 is represented with two concentric broken circles.

In the formula of the gallium phosphide used the equivalent factor $x$ is unity ($x$=1 in the formula Ga$Px$).

The original n-conductive silicon wafer of the preferred embodiment is not provided with gold atoms in its interior. Only in the exceptional case, when the $\tau$-values determined as described in page 19 are greater than 20 microseconds, is the interior of the wafer provided with gold atoms to act as internal recombination centers, therefore lowering the carrier lifetime.

It will be understood that the above description of the present invention is susceptible to various modifications, changes and adaptations, and the same are intended to be comprehended within the meaning and range of equivalents of the appended claims.

We claim:

1. A thyristor wherein at least four semiconductive regions are arranged in succession between two principal faces, the regions being of opposite conductivity type to their neighboring regions, and wherein an ohmically contacting electrode on one of the principal faces partially short circuits the PN-junction between the base region and an emitter region of said four regions, wherein the improvement comprises a net impurity center concentration equal to at least $10^{18}$ impurity centers per cubic centimeter at the surface of said base region in contact with said electrode, a continual decrease of the net impurity center concentration in said base region from its value at said electrode at least over the distance from said electrode to the side of said emitter region farthest from said electrode, and an ohmic contact of very small contact resistance between said electrode and said base region.

2. A thyristor as claimed in claim 1, wherein said ohmic contact between said electrode and said base region is formed by a base layer containing gold.

3. A thyristor as claimed in claim 2, wherein said ohmic contact between said electrode and said base region is formed by a base layer of gold alloyed into the semiconductive material of the base region, the semiconductive material being silicon.

4. A thyristor as claimed in claim 2, wherein the semiconductive regions are arranged in the sequence NPNP, the N-emitter region is pierced by a plurality of channels of the P-base region, said electrode is a cathode contact short circuiting the N-emitter region with said channels, and the net acceptor concentration in the P-base region continually decreases from its value at the short circuiting cathode to its value at the PN-junction between the P-base region and the N-base region.

5. A thyristor as claimed in claim 4, further comprising a gate electrode contacting said P-base region, the material of said semiconductive regions being silicon, the cathode and the gate electrode being formed of a base layer of gold-silicon eutectic having a thickness of about $1\times10^{-6}$ meters and, on the base layer, a vapor-deposited layer composite having a layer sequence chromium-gold-chromium, the total thickness of said layer composite being about $2\times10^{-6}$ meters.

6. A method for making a thyristor, comprising the steps of diffusing, in a first diffusion step, acceptor atoms into all sides of an N-conductive silicon wafer, diffusing, in a second diffusion step, acceptor atoms into all parts of a principal face of the wafer while simultaneously diffusing donor atoms into only some parts of said principal face for creating an N-emitter region set into a P-base region and for maintaining a net acceptor concentration on said principal face at least equal to that net acceptor concentration which existed after the first diffusion step and having a minimum value of $10^{18}$ atoms per cubic centimeter, and alloying into the silicon on said principal face in short circuiting relationship to said N-emitter region and said P-base region a layer of gold having a thickness of about $1\times10^{-6}$ meters.

7. A method as claimed in claim 6, wherein said acceptor atoms are gallium and said donor atoms are phosphorus.

8. A method as claimed in claim 7, wherein gallium phosphide is the source for said acceptor and donor atoms in the second diffusion step.

* * * * *